(12) United States Patent
Villareal et al.

(10) Patent No.: US 6,850,548 B2
(45) Date of Patent: Feb. 1, 2005

(54) ASSYMMETRIC DISTRIBUTED BRAGG REFLECTOR FOR VERTICAL CAVITY SURFACE EMITTING LASERS

(75) Inventors: Samuel S. Villareal, Richardson, TX (US); Ralph H. Johnson, Murphy, TX (US)

(73) Assignee: Finisar Corporation, Sunnyvale, CA (US)

( * ) Notice: Subject to any disclaimer, the term of this patent is extended or adjusted under 35 U.S.C. 154(b) by 310 days.

(21) Appl. No.: 10/028,435

(22) Filed: Dec. 28, 2001

(65) Prior Publication Data

US 2003/0123513 A1 Jul. 3, 2003

(51) Int. Cl.$^7$ .............................................. H01S 3/082
(52) U.S. Cl. ............................. 372/45; 372/44; 372/43; 372/46
(58) Field of Search ..................................... 372/45, 46

(56) References Cited

U.S. PATENT DOCUMENTS

| | | | | | |
|---|---|---|---|---|---|
| 5,745,515 | A | * | 4/1998 | Marta et al. | 372/45 |
| 5,764,671 | A | * | 6/1998 | Lebby et al. | 372/45 |
| 5,848,086 | A | * | 12/1998 | Lebby et al. | 372/46 |
| 6,201,825 | B1 | * | 3/2001 | Sakurai et al. | 372/96 |
| 6,301,281 | B1 | | 10/2001 | Deng et al. | |
| 6,611,543 | B2 | * | 8/2003 | Hwang | 372/45 |
| 2002/0131461 | A1 | * | 9/2002 | Strzelecki | 372/43 |
| 2002/0150135 | A1 | * | 10/2002 | Naone et al. | 372/45 |
| 2003/0031221 | A1 | * | 2/2003 | Wang et al. | 372/45 |

FOREIGN PATENT DOCUMENTS

EP 0536944 A 4/1993

OTHER PUBLICATIONS

Notification of Transmittal of the International Search Report or the Declaration, dated Feb. 17, 2004, relative to PCT, Application No. PCT/US02/39528, the foreign equivalent to the instant U.S. application 10/028,435.

Sugimoto M et al: "Very Low Threshold Current Density in Vertical–Cavity Surface–Emittin Laser Diodes with Periodically Doped Distributed Bragg Reflectors" Electronic Letters, IEE Stevenage, GB, vol. 28, No. 4, Feb. 13, 1992, pp. 385–387, XP000292299 ISSN: 0013–5194.

Chalmers S A et al: "Low Resistance Wavelength–Reproducible P–Type (AL,GA) as Distributed Bragg Reflectors Grown by Molecular Beam Epitaxy" Applied Physics Letters, American Institute of Physics. New York, US vol. 62, No. 14, Apr. 5, 1993, pp. 1585–1587, XP000355000 ISSN: 0003–6951.

Mizutani A et al: MOCVD Grwon InGaAs/GaAs Vertical Cavity Surface Emitting Laser on GaAs (311) B Substrate Electronics Letters, IEE Stevenage, GB, vol. 33, No. 22, Oct. 23, 1997, pp. 1877–1878, XP006008126 ISSN: 0013–5194.

* cited by examiner

*Primary Examiner*—Don Wong
*Assistant Examiner*—Dung T Nguyen
(74) *Attorney, Agent, or Firm*—Workman Nydegger

(57) ABSTRACT

An asymmetric distributed Bragg reflector (DBR) suitable for use in vertical cavity surface emitting lasers. The asymmetric DBR is comprised of stacked material layers having different indexes of refraction that are joined using asymmetrical transition regions in which the transition steps within a transition region have different material compositions, different doping levels, and different layer thicknesses. Adjacent transition regions have different transition steps. Thinner transition regions are relatively highly doped and are located where the optical standing wave within the DBR has a low field strength. Thicker transition regions are relatively lightly doped and are located where the optical standing wave has a relatively high field strength. Beneficially, in the $Al_xGa_{(1-x)}As$ material system the stacked material layers are alternating layers of AlAs and GaAs. Other material systems will use other alternating layers.

26 Claims, 3 Drawing Sheets

ASSYMMETRIC DISTRIBUTED BRAGG REFLECTOR FOR VERTICAL CAVITY SURFACE EMITTING LASERS

CROSS-REFERENCE TO RELATED APPLICATIONS

Not applicable.

BACKGROUND OF THE INVENTION

1. Field of the Invention

The present invention relates to laser mirror structures. More specifically, it relates to mirror structures suitable for use in vertical cavity surface emitting lasers.

2. Discussion of the Related Art

Vertical cavity surface emitting lasers (VCSELs) represent a relatively new class of semiconductor lasers. While there are many variations of VCSELs, one common characteristic is that they emit light perpendicular to a wafer's surface. Advantageously, VCSELs can be formed from a wide range of material systems to produce specific characteristics. In particular, the various material systems can be tailored to produce different laser wavelengths, such as 1550 nm, 1310 nm, 850 nm, 670 nm, and so on.

VCSELs include semiconductor active regions, distributed Bragg reflector (DBR) mirrors, current confinement structures, substrates, and contacts. Because of their complicated structure, and because of their material requirements, VCSELs are usually grown using metal-organic chemical vapor deposition (MOCVD) or molecular beam epitaxy (MBE).

FIG. 1 illustrates a typical VCSEL 10. As shown, an n-doped gallium arsenide (GaAS) substrate 12 has an n-type electrical contact 14. An n-doped lower mirror stack 16 (a DBR) is on the GaAS substrate 12, and an n-type graded-index lower spacer 18 is disposed over the lower mirror stack 16. An active region 20, usually having a number of quantum wells, is formed over the lower spacer 18. A p-type graded-index top spacer 22 is disposed over the active region 20, and a p-type top mirror stack 24 (another DBR) is disposed over the top spacer 22. Over the top mirror stack 24 is a p-type conduction layer 9, a p-type GaAs cap layer 8, and a p-type electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled to resonant at a predetermined wavelength (or at a multiple thereof). At least part of the top mirror stack 24 includes an insulating region 40 that provides for current confinement. The insulating region 40 is usually formed either by implanting protons into the top mirror stack 24 or by forming an oxide layer. The insulating region 40 defines a conductive annular central opening 42 that forms an electrically conductive path though the insulating region 40.

In operation, an external bias causes an electrical current 21 to flow from the p-type electrical contact 26 toward the n-type electrical contact 14. The insulating region 40 and the conductive central opening 42 confine the current 21 such that it flows through the conductive central opening 42 to the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-type conduction layer 9, through the p-type GaAs cap layer 8, through an aperture 30 in the p-type electrical contact 26, and out of the surface of the vertical cavity surface emitting laser 10.

It should be understood that FIG. 1 illustrates a typical VCSEL, and that numerous variations are possible. For example, the dopings can be changed (say, by providing a p-type substrate 12), different material systems can be used, operational details can be tuned for maximum performance, and additional structures, such as tunnel junctions, can be added.

While generally successful, VCSELs have problems. In particular, in some applications the available prior art distributed Bragg Reflectors (DBR) are significantly less than optimal. To understand why this is so it is beneficial to consider DBRs in more detail.

In many applications a DBR must be both highly reflective and highly electrically conductive. In fact, when used in a VCSEL a DBR must be particularly reflective so as to reduce optical losses to such a degree that laser operation is enabled. Reflectivity is achieved by stacking material layers having significantly different indexes of refraction, for example, by stacking alternating layers of AlAs and GaAs. Such stacked layers can produce an optical standing wave within the DBR.

While the optical performance of stacked AlAs and GaAs is very good, an abrupt junction between an AlAs layer and a GaAs layer would form a high barrier to current flow. To reduce that barrier, the layers of AlAs and GaAs are joined using a transition region in which the material composition gradually changes from AlAs to GaAs. Furthermore, in most VCSELs the DBR layers are doped to provide free carriers that reduce electrical resistance. The result is a structure that, ideally, has high reflectivity combined with both low optical absorption and low electrical resistance.

In practice, optical absorption increases with increasing electric field strength, increasing wavelength, and increasing doping levels. Furthermore, p-type dopants tend to have higher optical absorption than n-type dopants. On the other hand, electrical resistance is relatively unaffected by electrical field strength and optical wavelength, yet decreases with increasing doping levels. But, p-type carriers (holes) have much lower mobilities than n-type carriers (electrons). Therefore, as the wavelength increases, such as with VCSELs that output light at 1300, 1310, or 1550 nm, obtaining both low optical absorption and low electrical resistance is difficult. This is because long optical wavelengths tend to be highly absorbed by the free carriers that reduce the electrical resistance. Such is particularly true in top DBRs, which are usually p-doped. The lower mobility of the p-carriers and the higher optical absorption of p-dopants tend to reduce the performance of such top DBRs. Therefore, a conflict occurs in prior art long wavelength VCSELs: to reduce electrical resistance the free carrier concentration should be high, but to reduce light absorption the free carrier concentration should be low.

In addition, it should be understood that DBRs produce optical standing waves that are characterized by spatially dependent electrical fields. That is, the electric field strength varies across the DBR's thickness. Additionally, the materials that form a DBR strongly impact on the thermal characteristics of a VCSEL. Binary phase materials, such as AlAs and GaAs tend to have very good thermal conductivity. Thus, heat flows across AlAs and GaAs stacks very well. However, the transition region, which is characterized by three materials, has a significantly lower thermal conductivity. This is because the crystalline structure of the transition region is highly distorted, which reduces thermal conductivity.

Because of the foregoing, DBRs used in prior art VCSELs have problems with excessive optical absorption, relatively poor thermal conductivity, and relatively high electrical resistance, particularly when producing long wavelength light. Therefore, a new distributed Bragg reflector that has relatively low light absorption and relatively low electrical resistance, particularly at long wavelengths and in top DBRs, would be beneficial. Even more beneficial would be a new distributed Bragg reflector that has relatively low light absorption, relatively low electrical resistance, and relatively good thermal conductivity, particularly at long wavelengths and in top DBRs.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

Accordingly, the principles of the present invention are directed to a new distributed Bragg reflector (DBR) having low light absorption and low electrical resistance. Beneficially, such a DBR is implemented in a manner that results in good thermal conductivity.

A distributed Bragg reflector according to the principles of the present invention is comprised of stacked material layers having different indexes of refraction that are joined by asymmetrical transition regions in which the transition steps within a transition region have different material compositions, different doping levels, and different layer thicknesses. Furthermore, the adjacent transition regions having transition steps with different thicknesses and different doping levels. Beneficially, adjacent transition regions have different overall thicknesses, with the thinner transition regions being relatively highly doped and located where the optical standing wave within the DBR has low field strength, and with the thicker transition regions being relatively lightly doped and located where the optical standing wave has a relatively high field strength. The thinner transition regions improve both electrical and thermal conductivity.

Beneficially, the stacked material layers are comprised of alternating layers of AlAs and GaAs. Even more beneficially, the stacked material layers form a p-doped top mirror of a VCSEL, such as a long wavelength VCSEL.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWING

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

In the drawings.

Figure 1:
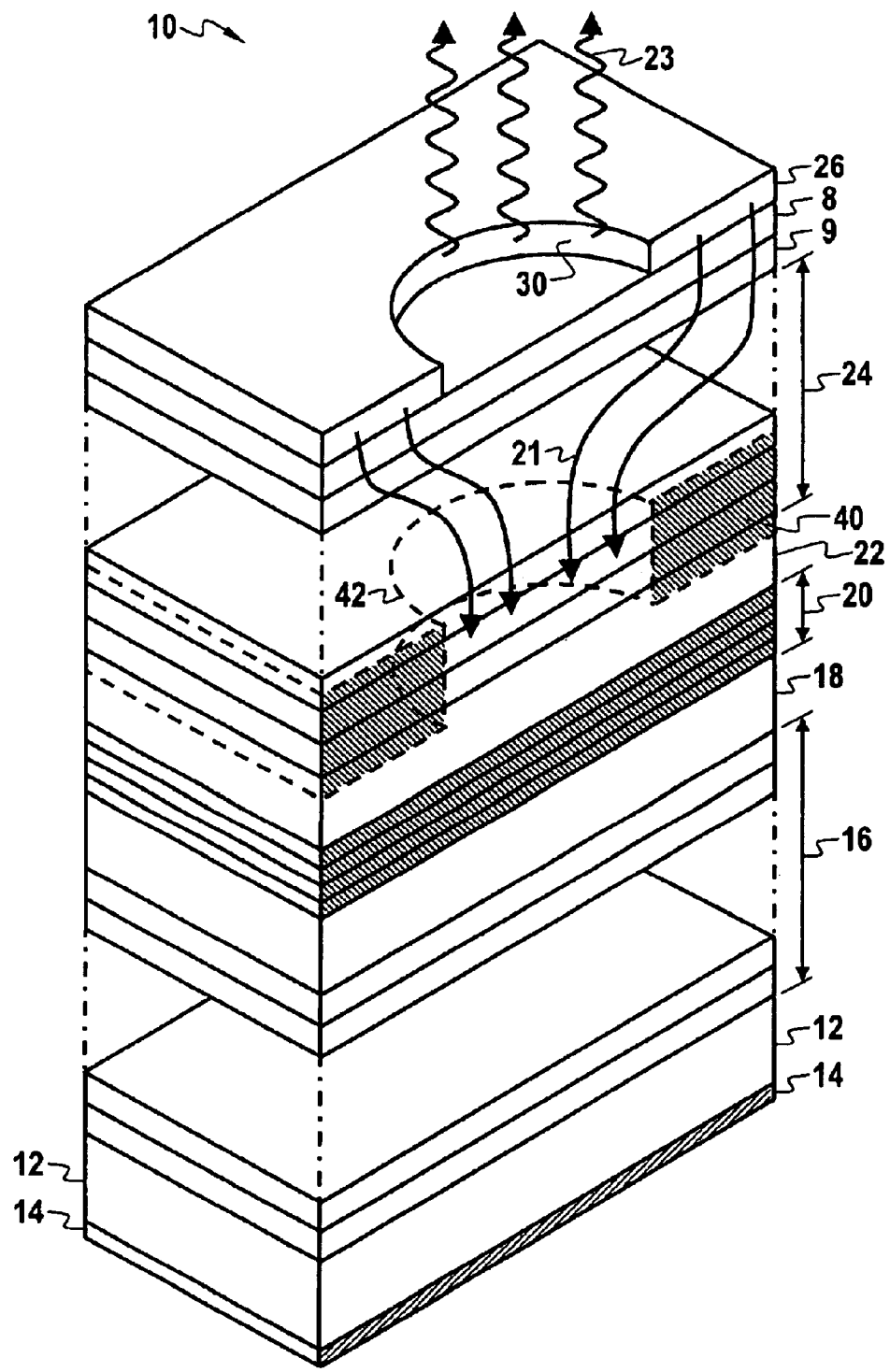
FIG. 1 illustrates a typical vertical cavity surface emitting laser.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENTS

Reference will now be made in detail to an embodiment of the present invention, example of which is illustrated in the accompanying drawings.

The principles of the present invention provide for asymmetrical distributed Bragg reflectors (DBRs), and for VCSELs that use asymmetrical DBRs.

Figure 2:
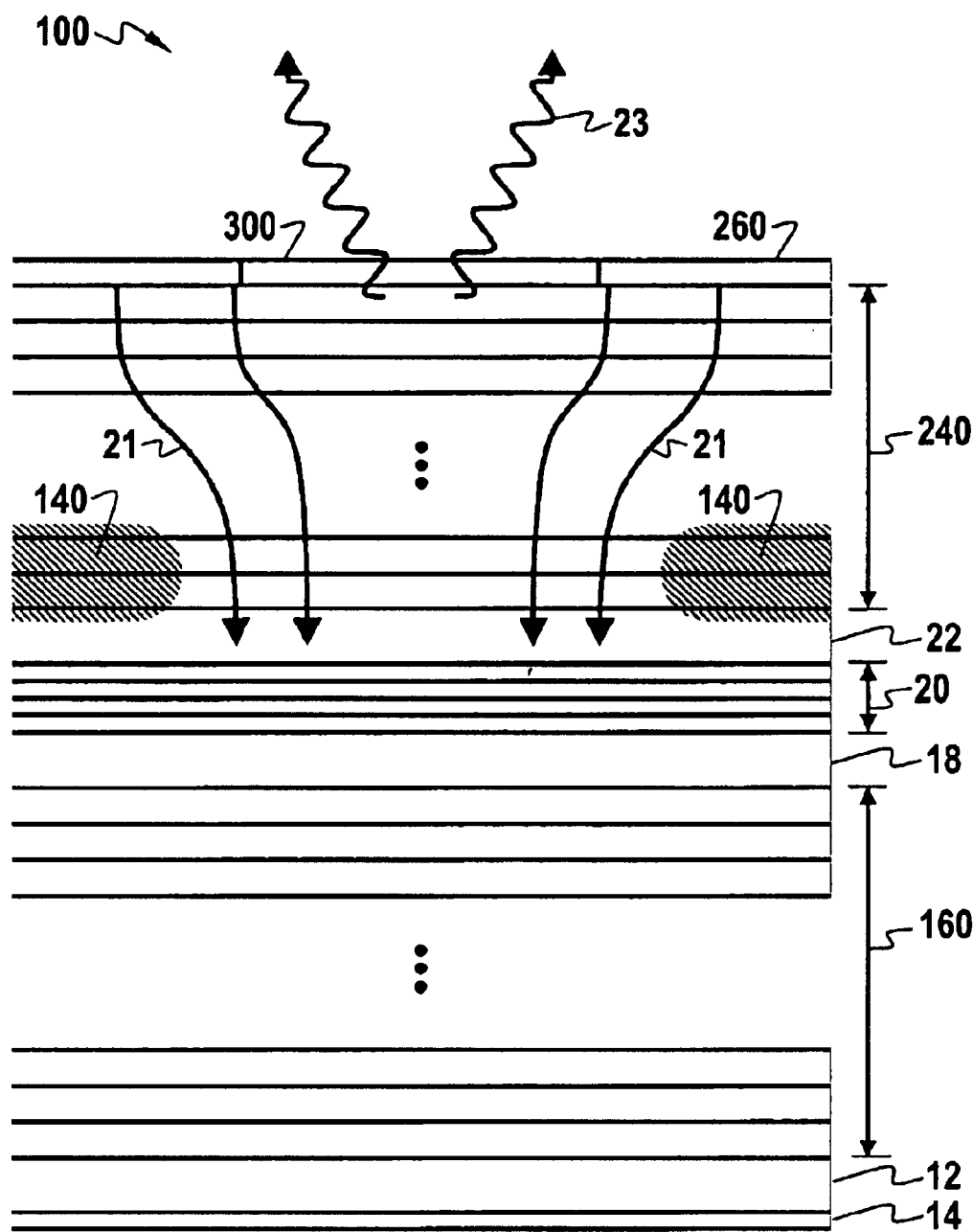
FIG. 2 illustrates a vertical cavity surface emitting laser according to the principles of the present invention.

Refer now to FIG. 2 for an illustration of a vertical cavity surface emitting laser (VCSEL) 100 that is in accord with the principles of the present invention. FIG. 2 should be understood as a simplified "cut-away" schematic depiction of a VCSEL that is generally configured as shown in FIG. 1. Thus, similar element numbers will be used for similar elements in FIG. 2 as were used in FIG. 1. However, the VCSEL 100 includes novel and useful top and bottom distributed Bragg reflectors (DBRs).

As shown in FIG. 2, the VCSEL 100 includes an n-doped gallium arsenide (GaAS) substrate 12 having an n-type electrical contact 14. An n-doped lower mirror stack 160 (a DBR) is on the GaAS substrate 12, and an n-type graded-index lower spacer 18 is disposed over the lower mirror stack 160. The lower mirror stack 160 is described in more detail subsequently.

An active region 20 having P-N junction structures with a number of quantum wells is formed over the lower spacer 18. The composition of the active region 20 is beneficially AlGaAs, with the specific aluminum content varying in the different layers that form the active region 20. For example, one layer may have between twenty and thirty percent of aluminum, while an adjacent layer might have between zero and five percent of aluminum. There could be many alternating layers, depending how the quantum wells are to be in the active region 20.

On the active region 20 is a p-type graded-index top spacer 22. A p-type top mirror stack 240 (another DBR) is disposed over the top spacer 22. The upper mirror stack 240 is described in more detail subsequently.

Over the top mirror stack 240 is a p-type conduction layer, a p-type GaAs cap layer, and a p-type electrical contact, all of which are designated as 260. As in the VCSEL 10 (see FIG. 1), the lower spacer 18 and the top spacer 22 separate the lower mirror stack 160 from the top mirror stack 240 such that an optical cavity that is resonant at a specific wavelength is formed.

Still referring to FIG. 2, the top mirror stack 240 includes an insulating region 140, which is beneficially produced by forming the top mirror stack 240 with an AlGaAs layer(s) having a high aluminum content (97–98%), and then oxidizing that high aluminum content layer along an annular ring. Oxidation then produces the oxide insulating region 140.

In operation, an external bias causes an electrical current 21 to flow into the VCSEL 100. The insulating region 140 forms a current guide into the active region 20 where some of the electrons are converted into photons. Those photons bounce back and forth (resonate) between the lower mirror stack 160 and the top mirror stack 240. While the lower mirror stack 160 and the top mirror stack 240 are very good reflectors, some of the photons leak out as light 23 that travels along an optical path. Still referring to FIG. 2, the light 23 passes through an opening 300 in the element 260 and out of the surface of the vertical cavity surface emitting laser 100.

The VCSEL 100 of FIG. 2 significantly differs from the VCSEL 10 of FIG. 1 by asymmetry in the top mirror stack 240 and in the lower minor stack 160. Those mirror stacks are beneficially formed from layers of different compositions of $Al_xGa_{1-x}As$. While the principles of the present invention are particularly suitable for use in p-doped top mirror stacks (because p-doped materials are optically more absorbent, those materials benefit more from the present invention), those principles are suitable for use with either type of doping. Furthermore, while the illustrated embodiment is based on the AlxGa1-xAs material system, the principles of the present invention are applicable to a wide range of compound semiconductor material systems.

Figure 3:
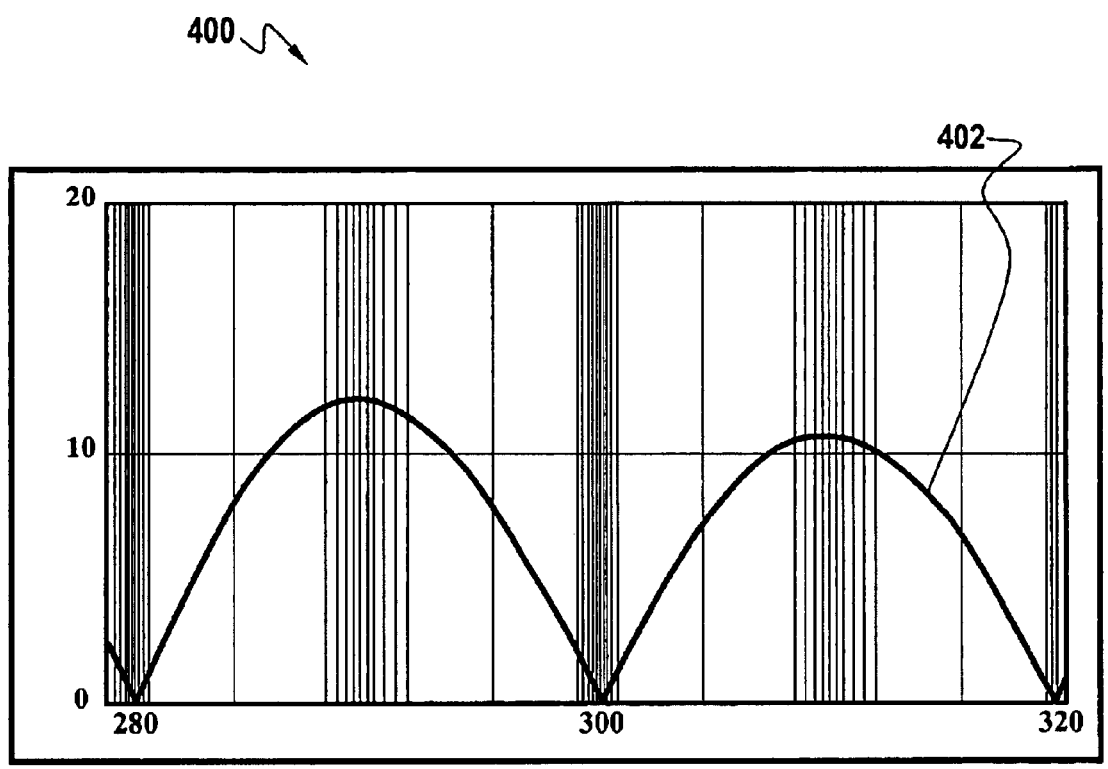
FIG. 3 illustrates a distributed Bragg reflector having a standing optical wave, with that distributed Bragg reflector being in accord with the principles of the present invention.

FIG. 3 illustrates a distributed Bragg reflector 400 that is suitable for use as either (or both) the lower mirror stack 160 or the top mirror stack 240. In operation, a standing wave is developed within the Distributed Bragg Reflector. A normalized power waveform 402 of such a standing wave, as computed by an optical simulation of a particular embodiment of this invention, is superimposed on the distributed Bragg reflector 400. FIG. 3 also illustrates relative thicknesses of the individual layers that comprise the distributed Bragg reflector 400, with the relative thickness of each layer being indicated by the space between vertical lines. As shown in FIG. 3, the distributed Bragg reflector 400 includes at least layers 280 through 320. In practice there can be multiple sets of such layers (thus a given distributed Bragg reflector could be comprised of hundreds of individual layers).

Still referring to FIG. 3, the closest vertical line spacing occurs where the electric field is smallest (close to zero), say around layer 300. This indicates the relatively small thicknesses of the layers that form an AlAs-to-GaAs junction (where the composition changes from 100% AlAs to 100% GaAs). The layers that form that junction have relatively high doping levels, which decrease the electrical resistance across the AlAs-to-GaAs transition region. However, because the electric field is low in that transition region, the optical absorption is also low, despite the high doping levels.

However, still referring to FIG. 3, where the electric field is high (say around layer 290) the vertical line spacing is the relatively large, which represents relatively thick individual layers. This represents an interface junction where the GaAs (0% Al) composition changes to AlAs (0% Ga). That area is relatively lightly doped to help to decrease optical absorption of the locally high electric field. The relatively large thickness of the GaAs-to-AlAs transition region helps to decrease the electrical resistance without significantly increasing the optical absorption.

Thus, a DBR that is in accord with the principles of the present invention is asymmetric in both the interface junction thickness and in the interface junction doping profile. The use of a coupled doping profile and composition profile also contributes to the improved performance of this invention.

An embodiment of an asymmetric p-doped DBR for use at 1310 nm in the $Al_xGa_{1-x}As$ material system having a 0% to 100% Al composition range is provided for in Table 1. Specific layer thicknesses, doping concentrations, and material compositions are provided. The first interface junction in Table 1 is the AlAs (100% Al composition) to GaAs (0% Al composition) heterojunction, consisting of the layers in row 1 through row 10. Similarly, the layers of the second interface junction, the GaAs (0% Al composition) to AlAs (100% Al composition) heterojunction, are listed in row 13 through row 22.

The asymmetry of this embodiment can be seen by comparing the total thickness of the first interface junction, 20 nm, with that of the second interface junction, 40 nm. This asymmetry is also seen as the steeper average slope of the leftmost, downward transition in material composition in FIG. 4 as compared with the less steep average slope of the rightmost, upward transition. Note that the doping concentration of the first interface junction ranges from 2.86E+18 cm−3 to 6.17E+18 cm−3, while that of the second interface junction ranges from 6.65E+17 cm−3 to 1.93E+18 cm−3. The asymmetry in the interface junction thickness and the asymmetry in doping range work together to provide a lower optical absorption and lower electrical resistance than either separately.

TABLE 1

| Layer | Thickness (nm) | Dopant Concentration (cm$^{-3}$) | Composition (% Al) |
|---|---|---|---|
| 1 | 2.50 | 6.17E+18 | 99 |
| 2 | 2.50 | 6.42E+18 | 94 |
| 3 | 2.00 | 6.22E+18 | 84 |
| 4 | 1.50 | 5.59E+18 | 71 |
| 5 | 1.50 | 4.79E+18 | 52 |
| 6 | 1.50 | 4.22E+18 | 42 |
| 7 | 1.50 | 3.44E+18 | 29 |
| 8 | 2.00 | 2.88E+18 | 15 |
| 9 | 2.50 | 2.61E+18 | 5 |
| 10 | 2.50 | 2.86E+18 | 1 |
| 11 | 33.99 | 2.86E+18 | 0 |
| 12 | 33.99 | 6.65E+17 | 0 |
| 13 | 5.00 | 6.65E+17 | 1 |
| 14 | 5.00 | 3.42E+17 | 5 |
| 15 | 4.00 | 3.80E+17 | 15 |
| 16 | 3.00 | 6.94E+17 | 0.29 |
| 17 | 3.00 | 1.11E+18 | 0.42 |
| 18 | 3.00 | 1.37E+18 | 52 |
| 19 | 3.00 | 1.90E+18 | 71 |
| 20 | 4.00 | 2.23E+18 | 84 |
| 21 | 5.00 | 2.28 + 18 | 94 |
| 22 | 5.00 | 1.93 + 18 | 99 |
| 23 | 36.71 | 1.93 + 18 | 100 |
| 24 | 36.71 | 6.17 + 18 | 100 |

There are circumstances for which a 0% to 100% range in material composition variation is undesirable. Therefore, Table 2 provides another embodiment DBR that is in accord with the principles of the present invention. That DBR is a p-doped $Al_xGa_{(1-x)}As$ DBR suitable for use in a 1310 nm VCSEL. That DBR has a restricted Al composition range of 0% to 85%.

TABLE 2

| Layer | Thickness (nm) | Dopant Concentration (cm$^{-3}$) | Composition (% Al) |
|---|---|---|---|
| 1 | 2.50 | 4.77E+18 | 84 |
| 2 | 2.50 | 4.96E+18 | 80 |
| 3 | 2.00 | 4.80E+18 | 71 |
| 4 | 1.50 | 4.32E+18 | 60 |
| 5 | 1.50 | 3.70E+18 | 44 |
| 6 | 1.50 | 3.26E+18 | 36 |
| 7 | 1.50 | 2.66E+18 | 25 |
| 8 | 2.00 | 2.23E+18 | 13 |
| 9 | 2.50 | 2.01E+18 | 4 |
| 10 | 2.50 | 2.21E+18 | 1 |
| 11 | 33.99 | 2.21E+18 | 0 |
| 12 | 33.99 | 7.00E+17 | 0 |
| 13 | 5.00 | 7.00E+17 | 1 |
| 14 | 5.00 | 3.60E+17 | 4 |
| 15 | 4.00 | 4.00E+17 | 13 |
| 16 | 3.00 | 7.30E+17 | 25 |
| 17 | 3.00 | 1.17E+18 | 36 |
| 18 | 3.00 | 1.44E+18 | 44 |
| 19 | 3.00 | 2.00E+18 | 60 |
| 20 | 4.00 | 2.35E+18 | 71 |
| 21 | 5.00 | 2.40E+18 | 80 |
| 22 | 5.00 | 2.03E+18 | 84 |
| 23 | 36.71 | 2.03E+18 | 85 |
| 24 | 36.71 | 4.77E+18 | 85 |

The two-fold asymmetry of total interface junction thickness and doping concentration range of this embodiment is apparent from Table 2. Furthermore, comparing the rows of Table 2 with the corresponding rows of Table 1 shows that the doping concentration ranges differ in addition to the material composition ranges. Thus, the best embodiments of this invention may vary in many ways, including the number of steps, the individual step size, the total heterojunction thickness, the doping concentration range and the material composition range.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. A distributed Bragg reflector, comprising:
   a doped first semiconductor layer including a first binary composition and having a first index of refraction;
   a doped second semiconductor layer including a second binary composition and having a second index of refraction that is different than said first index of refraction; and
   a first transition region interposed between said first semiconductor layer and said second semiconductor layer, wherein said first transition region includes a plurality of doped first transition semiconductor layers having a plurality of thicknesses and a plurality of doping levels.

2. A distributed Bragg reflector according to claim 1, further including:
   a doped third semiconductor layer including said first binary composition; and
   a second transition region interposed between said second semiconductor layer and said third semiconductor layer, said second transition region including a plurality of doped second transition semiconductor layers having a plurality of thicknesses and a plurality of doping levels, wherein said second transition region is different than said first transition region.

3. A distributed Bragg reflector according to claim 1, wherein said first semiconductor layer includes AlAs.

4. A distributed Bragg reflector according to claim 3, wherein said second semiconductor layer includes GaAs, and wherein said doped first transition semiconductor layers includes Al, Ga, and As.

5. A laser, comprising:
   a doped substrate;
   an active region adjacent said substrate, said active region emitting light at a predetermined wavelength in response to an applied electric current;
   a doped first distributed Bragg reflector mirror between said active region and said substrate, said first distributed Bragg reflector mirror reflecting light emitted by said active region back toward said active region;
   a doped second distributed Bragg reflector mirror adjacent said active region, said second distributed Bragg reflector mirror reflecting light emitted by said active region back toward said active region;
   wherein said second distributed Bragg reflector mirror includes:
      a doped first mirror semiconductor layer including a first binary composition and having a first index of refraction;
      a doped second mirror semiconductor layer including a second binary composition and having a second index of refraction that is different than said first index of refraction; and
      a first transition mirror region between said first mirror semiconductor layer and said second mirror semiconductor layer, said first transition mirror region including a plurality of doped first transition mirror semiconductor layers having a plurality of thicknesses and a plurality of doping levels.

6. The laser according to 5, wherein said laser light output is emitted perpendicular to said substrate.

7. The laser according to 6, further including:
   a doped third mirror semiconductor layer including said first binary composition and having said first index of refraction; and
   a second transition mirror region between said second mirror semiconductor layer and said third mirror semiconductor layer, said second transition mirror region including a plurality of doped second transition mirror semiconductor layers having a plurality of thicknesses and a plurality of doping levels, wherein said second transition mirror region is different than said first transition mirror region.

8. The laser according to 7, wherein light emitted by said active region at said predetermined wavelength produces a minimum electric field in said first transition mirror region.

9. The laser according to 8, wherein said first transition mirror semiconductor layers are doped more heavily than said second transition mirror semiconductor layers.

10. The laser according to 8, said second transition mirror region is thicker than said first transition mirror region.

11. The laser according to 7, wherein said first binary composition is AlAs.

12. The laser according to 11, wherein said second binary composition is GaAs.

13. The laser according to 12, wherein said first transition mirror semiconductor layers include layers including Al, Ga, and As.

14. The laser according to 5, wherein said active region includes at least one quantum well.

15. The laser according to 5, wherein said second distributed Bragg reflector mirror is p-doped.

16. The laser according to 5, wherein said second distributed Bragg reflector mirror includes an insulating region for confining current inside laser.

17. The laser according to 5, further including a spacer between said second distributed Bragg reflector mirror and said active region.

18. The laser according to 5, wherein said first distributed Bragg reflector mirror includes:
    an n-doped first bottom mirror semiconductor layer including said first binary composition,
    an n-doped second bottom mirror semiconductor layer including said second binary composition; and
    a first transition bottom mirror region between said first bottom mirror semiconductor layer and said second bottom mirror semiconductor layer, said first transition bottom mirror region including a plurality of n-doped mirror semiconductor layers having a plurality of thicknesses and a plurality of doping levels.

19. A vertical cavity surface emitting laser, comprising:
    an n-doped substrate;
    an active region adjacent said substrate, said active region emitting light at a predetermined wavelength in response to an applied electric current;
    an n-doped bottom distributed Bragg reflector mirror reflecting light emitted by said active region back toward said active region;
    a doped top distributed Bragg reflector mirror adjacent said active region, said top distributed Bragg reflector mirror reflecting light emitted by said active region back toward said active region;
    wherein said top distributed Bragg reflector mirror includes:
        a doped first mirror semiconductor layer including AlAs;
        a doped second mirror semiconductor layer including GaAs; an
        a first transition mirror region between said first mirror semiconductor layer and said second mirror semiconductor layer, said first transition mirror region including a plurality of doped $Al_xG_{1-x}As$ layers having a plurality of thicknesses, a plurality of doping levels, and a plurality of compositions.

20. The vertical cavity surface emitting laser according to 19, wherein said first transition mirror region has $Al_xGa_{(1-x)}As$ layers that have between 0% and 85% Al composition.

21. The distributed Bragg reflector according to claim 1, wherein each of said plurality of doped first transition semiconductor layers has different thicknesses and different doping levels from each other.

22. The distributed Bragg reflector according to claim 2, wherein each of said plurality of doped second transition semiconductor layers has different thicknesses and different doping levels from each other.

23. The laser according to claim 5, wherein each of said plurality of doped first transition semiconductor layers has different thicknesses and different doping levels from each other.

24. The laser according to claim 7, wherein each of said plurality of doped second transition semiconductor layers has different thicknesses and different doping levels from each other.

25. The laser according to claim 18, wherein each of said plurality of n-doped mirror semiconductor layers has different thicknesses and different doping levels from each other.

26. The vertical cavity surface emitting laser according to claim 19, wherein each of said plurality of doped $Al_xGa_{1-x}As$ layers has different thicknesses, different doping levels and different compositions from each other.

* * * * *

UNITED STATES PATENT AND TRADEMARK OFFICE
CERTIFICATE OF CORRECTION

PATENT NO. : 6,850,548 B2 Page 1 of 1
APPLICATION NO. : 10/028435
DATED : February 1, 2005
INVENTOR(S) : Samuel S. Villareal and Ralph H. Johnson It is certified that error appears in the above-identified patent and that said Letters Patent is hereby corrected as shown below:

Cover Page
Item 54, TITLE, change "ASSYMMETRIC" to --ASYMMETRIC--
Item 56, OTHER PUBLICATIONS, line 3, after "PCT" change "," to --.--
Item 56, OTHER PUBLICATIONS, line 6, change "Emittin" to --Emitting--
Item 56, OTHER PUBLICATIONS, line 16, change "Grwon" to --Grown--

Column 1
Line 50, change "resonant" to --resonate--

Column 3
Line 49, change "ALAs" to --AlAs--

Column 4
Line 41, change "(GaAS)" to --(GaAs)--
Line 43, change "GaAS" to --GaAs--

Column 5
Line 22, "minor" to --mirror--
Line 30, "AlxGa1-xAs" to --$Al_xGa_{1-x}As$--
Line 61, change "290" to --402--

Column 6
Line 26, change "FIG. 4" to --FIG. 3--

Signed and Sealed this

Twenty-fourth Day of October, 2006

JON W. DUDAS
*Director of the United States Patent and Trademark Office*